(12) United States Patent
Kwon et al.

(10) Patent No.: US 9,627,436 B2
(45) Date of Patent: **\*Apr. 18, 2017**

(54) SUBSTRATE FREE LED PACKAGE

(71) Applicant: BRIDGELUX, INC., Livermore, CA (US)

(72) Inventors: Mike Kwon, Pleasanton, CA (US);
Gerry Keller, Livermore, CA (US);
Scott West, Pleasanton, CA (US); Tao Tong, Pleasanton, CA (US); Babak Imangholi, Livermore, CA (US)

(73) Assignee: BRIDGELUX, INC., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/214,202

(22) Filed: Mar. 14, 2014

(65) Prior Publication Data

US 2014/0197430 A1 Jul. 17, 2014

Related U.S. Application Data

(63) Continuation of application No. 13/619,886, filed on Sep. 14, 2012, now Pat. No. 8,748,202.

(51) Int. Cl.
*H01L 21/00* (2006.01)
*H01L 27/15* (2006.01)
*H01L 33/52* (2010.01)
*H01L 33/48* (2010.01)
*H01L 33/58* (2010.01)
(Continued)

(52) U.S. Cl.
CPC ............ *H01L 27/156* (2013.01); *H01L 24/18* (2013.01); *H01L 33/486* (2013.01); *H01L 33/52* (2013.01); *H01L 33/58* (2013.01); *H01L 33/60* (2013.01); *H01L 33/0095* (2013.01);
(Continued)

(58) Field of Classification Search
None
See application file for complete search history.

(56) References Cited

U.S. PATENT DOCUMENTS 5,411,921 A 5/1995 Negoro
7,622,746 B1 11/2009 Lester et al.
(Continued)

OTHER PUBLICATIONS

Navjot Chhabra, RCP Operations Manager, Freescale Semiconductor, Freescales Redistributed Chip Packaging (RCP) Ready for Production (Powerpoint Presentation), Jun. 2010.
(Continued)

*Primary Examiner* — Reema Patel
(74) *Attorney, Agent, or Firm* — Arent Fox LLP

(57) ABSTRACT

A method of fabricating a substrate free light emitting diode (LED), includes arranging LED dies on a tape to form an LED wafer assembly, molding an encapsulation structure over at least one of the LED dies on a first side of the LED wafer assembly, removing the tape, forming a dielectric layer on a second side of the LED wafer assembly, forming an oversized contact region on the dielectric layer to form a virtual LED wafer assembly, and singulating the virtual LED wafer assembly into predetermined regions including at least one LED. The tape can be a carrier tape or a saw tape. Several LED dies can also be electrically coupled before the virtual LED wafer assembly is singulated into predetermined regions including at the electrically coupled LED dies.

9 Claims, 5 Drawing Sheets

(51) Int. Cl.
*H01L 33/60* (2010.01)
*H01L 23/00* (2006.01)
*H01L 33/00* (2010.01)

(52) U.S. Cl.
CPC ............ *H01L 2924/12041* (2013.01); *H01L 2924/12042* (2013.01); *H01L 2933/0033* (2013.01)

(56) References Cited

U.S. PATENT DOCUMENTS

| | | | |
|---|---|---|---|
| 7,781,780 B2 | 8/2010 | Lin | |
| 8,748,202 B2* | 6/2014 | Kwon et al. | 438/34 |
| 2004/0137656 A1 | 7/2004 | Singh | |
| 2006/0033184 A1* | 2/2006 | Park et al. | 257/666 |
| 2010/0019370 A1* | 1/2010 | Pressel | B81B 7/02 257/690 |
| 2010/0029023 A1 | 2/2010 | Neff et al. | |
| 2010/0065983 A1 | 3/2010 | Kawakubo | |
| 2010/0295068 A1 | 11/2010 | Seo et al. | |
| 2011/0017407 A1* | 1/2011 | Hsu | H01L 21/67005 156/753 |
| 2011/0025191 A1 | 2/2011 | Xu | |
| 2011/0026263 A1 | 2/2011 | Xu | |
| 2011/0089454 A1 | 4/2011 | Xu | |
| 2011/0089457 A1 | 4/2011 | Xu | |
| 2012/0262903 A1* | 10/2012 | Li et al. | 362/84 |

OTHER PUBLICATIONS

Beth Keser, et al., The Redistributed Chip Package: A Breakthrough for Advanced Packaging, Electronic Components and Technology Conference, 2007. ECTC '07. Proceedings. 57th. Date of Conference: May 29, 2007-Jun. 1, 2007, pp. 286-291.

Lakshmi N. Ramanathan, et al., Implementation of a Mobile Phone Module with Redistributed Chip Packaging; Electronic Components and Technology Conference, 2008. ECTC 2008. 58th. Date of Conference: May 27-30, 2008, pp. 1117-1120.

Lars Boettcher, et al., Embedding Chips for System in Package Realization—Technology and Applications; Microsystems, Packaging, Assembly & Circuits Technology Conference, 2008. Impact 2008. 3rd International. Date of Conference: Oct. 22-24, 2008, pp. 383-386.

* cited by examiner

SUBSTRATE FREE LED PACKAGE

CLAIM OF BENEFIT TO PRIOR APPLICATIONS

This Application is a continuation of U.S. patent application Ser. No. 13/619,886, entitled "Substrate Free LED Package", filed Sep. 14, 2012, which is incorporated herein by reference.

BACKGROUND OF THE INVENTION

Field of the Invention

The present invention generally relates to a chip package and a method of manufacturing the same, and more particularly to a light emitting diode (LED) chip package without a substrate and a method of manufacturing the same.

Background

LED chips emit light in response to excitation by an electrical current. One typical LED includes a heterostructure grown on a substrate by metal-organic vapor phase epitaxy or similar techniques. An LED heterostructure includes n and p type semiconductor layers that sandwich light producing layers. Exemplary light producing layers may be quantum wells surrounded by barrier layers. Typically, electrical contacts are attached to n and p semiconductor cladding layers. When a forward bias is applied across electrical contacts, electrons and holes flow from n and p layers into a light producing active region. Light is produced when these electrons and holes recombine with each other in an active region comprising at least one semiconductor material.

LED chips are typically enclosed in a package that extracts the light and protects the chip from being damaged. The LED package typically includes phosphors that convert light generated by the LED into white light, a lens that directs light, contact pads for electrically connecting the LED package to an external circuit, as well as other components. The cost of packaging the LED chip can significantly contribute to the overall cost of making an LED device and is therefore an important factor into whether LED devices can be made commercially viable for consumers.

Therefore, there is a need for an LED device that can be manufactured and packaged in high volumes and delivered to consumers at low cost.

SUMMARY OF THE INVENTION

Accordingly, embodiments are directed to a substrate free LED package and method of manufacturing the same that substantially obviates one or more of the problems due to limitations and disadvantages of the related art.

Embodiments provide techniques for fabricating substrate free LED devices in high volumes at low cost with fewer process steps while maintaining high LED performance, consistent color uniformity, and high manufacturing yields. The techniques for fabricating these substrate free LED devices reduce the fabrication costs associated with packaging LED devices making them more affordable and more likely to be adopted by consumers. These techniques include packaging substrate free LED chips, and provide processes that permit high design flexibility by eliminating die attach and wire bonding processes used in LED packaging.

In one embodiment, a method of fabricating a substrate free LED includes arranging LED dies on a tape to form an LED wafer assembly, molding an encapsulation structure over at least one of the LED dies on a first side of the LED wafer assembly, removing the tape, forming a dielectric layer on a second side of the LED wafer assembly, forming an oversized contact region on the dielectric layer to form a virtual LED wafer assembly, and singulating the virtual LED wafer assembly into predetermined regions including at least one LED. The tape can be a carrier tape or a saw tape. In one embodiment a protective film can be formed over the encapsulation structure.

In another embodiment, the tape on which the LED dies are arranged is a carrier tape. In this embodiment, a pick and place procedure is used to do the arrangement of the LED dies. Before arranging the LED dies on the carrier tape, this embodiment can further include, placing a wafer having LED dies on the saw tape, singulating the LED dies by cutting the wafer completely through and partially cutting the saw tape to a depth less than the thickness of the saw tape, and expanding the saw tape to increase the spacing between the singulated LED dies. In one embodiment, each of the LED dies that are arranged on a carrier tape can be configured to emit light at a wavelength, where the variation in wavelengths between dies disposed on the carrier tape ranges from about 0 nm to about 2.5 nm relative to each other.

In yet another embodiment, the tape on which the LED dies are arranged is a saw tape. This embodiment can further include disposing a wafer having LED dies on the saw tape, singulating the LED dies by cutting the wafer completely through and partially cutting the saw tape to a depth less than the thickness of the saw tape, and expanding the saw tape to increase the spacing between the singulated LED dies.

In yet another embodiment, molding an encapsulation structure includes forming a phosphor loaded silicon material over the LED dies.

In yet another embodiment, molding an encapsulation structure includes molding a lens selected from the group consisting of a flat lens, a dome lens, or a Fresnel lens.

In another embodiment, a method of fabricating a substrate free LED includes arranging LED dies, which include die contacts, on a tape to form an LED wafer assembly, molding an encapsulation structure over at least one of the LED dies on a first side of the LED wafer assembly, removing the tape to expose the die contacts, forming a dielectric layer on a second side of the LED wafer assembly, electrically coupling at least one die contact from a first die with at least one die contact from a second die, forming an oversized contact region on the dielectric layer to form a virtual LED wafer assembly, and singulating the virtual LED wafer assembly into predetermined regions including at least the electrically coupled first die and second die. The tape can be a carrier tape or a saw tape. In one embodiment, a protective film can be formed over the encapsulation structure.

In another embodiment where at least two dies are electrically coupled to each other before the virtual LED wafer assembly is singulated, the tape on which the LED dies are arranged is a carrier tape. In this embodiment, a pick and place procedure is used to arrange the LED dies on the carrier tape. Before arranging the LED dies on the carrier tape, this embodiment can further include, disposing a wafer having LED dies on the saw tape, singulating the LED dies by cutting the wafer completely through and partially cutting the saw tape to a depth less than the thickness of the saw tape, and expanding the saw tape to increase the spacing between the singulated LED dies. In one embodiment, each of the LED dies that are arranged on a carrier tape can be configured to emit light at a wavelength, where the variation in wavelengths between dies disposed on the carrier tape ranges from about 0 nm to about 2.5 nm relative to each other.

In yet another embodiment, where at least two dies are electrically coupled to each other before the virtual LED wafer assembly is singulated, the tape on which the LED dies are arranged is a saw tape. This embodiment can further include disposing a wafer having LED dies on the saw tape, singulating the LED dies by cutting the wafer completely through and partially cutting the saw tape to a depth less than the thickness of the saw tape, and expanding the saw tape to increase the spacing between the singulated LED dies.

In another embodiment, a substrate free LED includes an LED die having at least one contact, a dielectric layer formed on a first side of the LED, an oversized contact region on the dielectric layer, and an encapsulation structure on a second side of the LED die. The oversized contact region is electrically coupled to the at least one contact.

In yet another embodiment, the dielectric layer of the substrate free LED includes a Distributed Bragg Reflector (DBR) which has a high index of refraction dielectric material adjacent to a low-index of refraction dielectric material.

In yet another embodiment, the oversized contact region of the substrate free LED includes a fan out structure.

In yet another embodiment, the oversized contact region of the substrate free LED includes a portion that extends to an end of the LED die through the dielectric layer.

In yet another embodiment, the oversized contact region of the substrate free LED includes at least one of Al, Ag, Rh, Pd, Cu, Au, Cr, Ti, W, and Ni.

In yet another embodiment, the substrate free LED includes at least one of a vertical LED structure with electrical on the same side, lateral LED structure, flip chip, or thin-film LED structure.

In yet another embodiment, the substrate free LED includes a protective film formed on the LED structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1A:
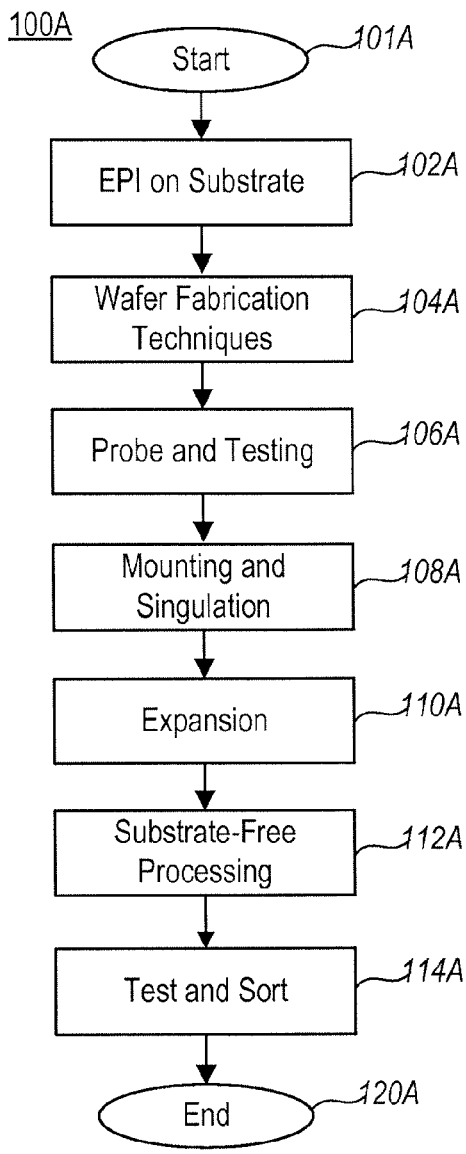
FIG. 1A is an exemplary flow chart illustrating the formation of a substrate free LED package where packaging operations are performed on dies disposed on saw tape, according to embodiments.

Various aspects of the invention will be described herein with reference to drawings that are schematic illustrations of idealized configurations of the present invention. As such, variations from the shapes of the illustrations resulting from manufacturing techniques, tolerances, etc., are to be expected. Thus, the various aspects of the invention presented throughout this disclosure should not be construed as limited to the particular shapes of elements (e.g., regions, layers, sections, substrates, etc.) illustrated and described herein, but are to include deviations in shapes that result, for example, from manufacturing. By way of example, an element illustrated or described as a rectangle may have rounded or curved features and/or a gradient concentration at its edges rather than a discrete change from one element to another.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending on the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. In addition, something that is described as being "transparent" should be understood as having a property that allows no significant obstruction or absorption of electromagnetic radiation in the particular wavelength (or wavelengths) of interest, unless a particular transmittance is provided. It will be further understood that when an element is referred to as being "formed" on another element, it can be grown, deposited, etched, attached, connected, coupled, or otherwise prepared or fabricated on the other element or an intervening element.

Embodiments provide techniques for fabricating substrate free LED devices in high volumes at low cost with fewer process steps while maintaining high LED performance, consistent color uniformity, and high manufacturing yields. The techniques for fabricating these substrate free LED devices reduces the fabrication costs associated with packaging LED devices, making them more affordable and more likely to be adopted by consumers. These techniques include packaging substrate free LED chips and provide processes that permit high design flexibility by eliminating die attach and wire bonding processes used in LED packaging.

FIG. 1A is an exemplary flow chart 100A illustrating the formation of a substrate free LED package where packaging operations are performed on dies disposed on saw tape. The process starts in operation 101A, where a substrate is provided for epitaxially forming a light emitting diode (LED). In operation 102A, an epitaxial layer, e.g., gallium nitride, is formed via metal-organic chemical vapor deposition (MOCVD) or molecular beam epitaxy (MBE), as known in the art, on the substrate. The substrate may be made of any material, such as, for example, sapphire, silicon, silicon carbide, gallium nitride, aluminum nitride, or the like.

In operation 104A, wafer fabrication techniques are used to form an LED wafer assembly. The LED wafer assembly may include at least one of a vertical LED structure with electrical contacts on the same side, lateral LED structure, flip chip, or thin-film LED structure. Examples of the wafer fabrication techniques that are known in the art include photolithography, doping, etching, and other semiconductor processing techniques. At the end of operation 104A, an LED wafer assembly includes a plurality of LED dies, e.g., one hundred or more LED dies having associated electrical contacts and light emitting regions. In one embodiment, the wafer assembly is further described with reference to U.S. Pat. No. 7,781,780, which is hereby incorporated by reference as if fully set forth herein.

Optionally operation 106A may be performed after operation 104A. In operation 106A, the LED wafer assembly is probed and tested by a computerized probing device for the purpose of associating X and Y values with each die, e.g., wavelength tested in order to determine a wavelength of each die and distribution across the wafer. For example, during the probing process, each die is energized and various characteristics are determined, e.g., wavelength, lumen output, voltage, current, and any other operating parameters are collected and associated with each die. In one embodiment, the measured parameters for each die are mapped to X and Y values based on at least one of these characteristics. Thus, each die is associated with its own X and Y values prior to singulation.

Next, in operation 108A, mounting and singulation processes are performed on the LED wafer assembly to divide the LED wafer assembly. The LED wafer assembly is mounted onto a saw tape and then cut into individual dies. The cutting process singulates the dies into individual dies without cutting all the way through the saw tape. This process leaves the dies attached to the saw tape, which is expandable, in the same configuration that the dies were on the wafer. By singulating the LED dies on the saw tape and expanding the saw tape in operation 110A, the individual LED dies are spaced apart further from each other than they are on the wafer. Increasing the spacing between the LED dies makes it easier to perform packaging steps on the separated LED dies, as described with reference to FIGS. 3-5 below. This expansion operation 110A can be performed by stretching the saw tape having the LED dies mounted thereon to a predetermined size.

An example of saw tape is the PROFILM™ DU177E product manufactured by Advantek, Inc. with Global Operation Headquarters in Calamba City, Philippines. Other examples of saw tape can be used that are known to those skilled in the art. In one embodiment, the singulation is performed using front-side laser scribing to scribe the LED wafer assembly into individual LED dies. The scribing is performed to a depth that does not cut all the way through the saw tape. In another embodiment, the wafer is mounted onto the saw tape and the dies are singulated into groups of dies or arrays. Afterwards, each group of dies or arrays is then processed as illustrated in FIGS. 3-5.

In operation 112A, the LED dies, which are disposed on the expanded saw tape, are packaged using substrate free packaging techniques. The substrate free packaging techniques are used to encapsulate the LED die, form a phosphor and/or lens on the LED die, form contacts to the LED die leads, make electrical connections, etc., as described in further detail with reference to FIGS. 3-5. Encapsulation includes encapsulating the LED dies in a transparent encapsulation material such as transparent silicone. Alternatively, other transparent materials such as transparent acrylic materials including, for example, poly(methyl methacrylate) PMMA or polycarbonate can be used. The encapsulation material may be used to extract the light emitted from the LED dies, as well as protect the LED dies. By encapsulating the LED dies, they become extremely durable with no loose or moving parts. Singulation includes cutting the dies from the saw tape into a group having a predetermined number of dies or into individual dies.

As described herein, the substrate free LED processing of operation 112A is used to form a virtual LED wafer assembly or substrate free LED package.

Next in operation 114A, a test and sort operation is used to test the packaged LEDs and sort the packaged LEDs. Testing the LEDs can include testing for resistance, light output, efficiency, etc. Sorting can be done according to any predetermined testable parameters such as resistance, light output, efficiency, etc. The process ends in operation 120A after the LED dies are tested and sorted.

Figure 1B:
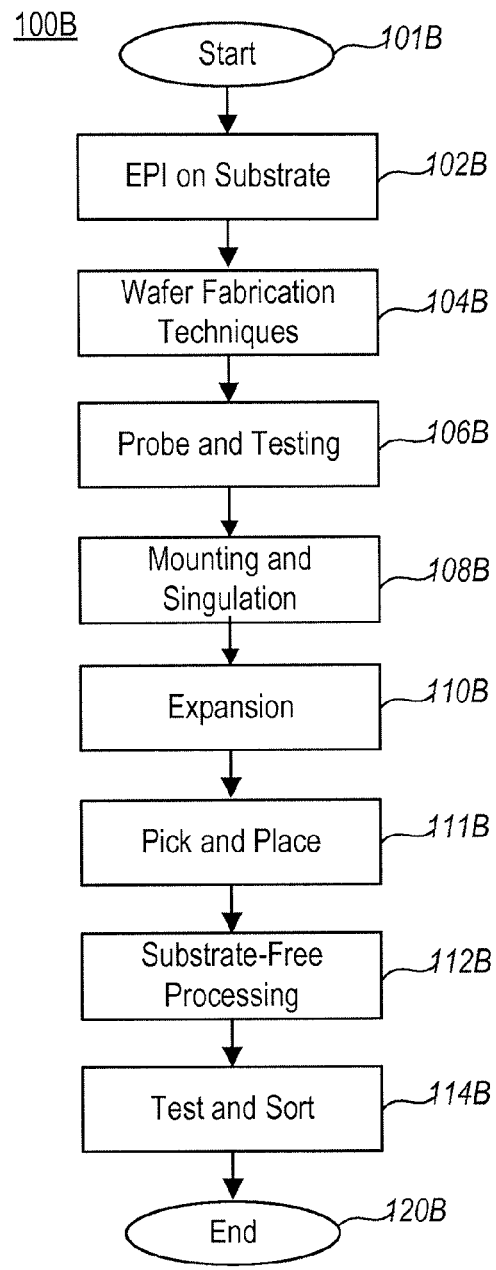
FIG. 1B is an exemplary flow chart illustrating the formation of a substrate free LED package where packaging operations are performed on dies disposed on carrier tape, according to embodiments.

FIG. 1B is another exemplary flow chart 100B illustrating the formation of a substrate free LED package where packaging operations are performed on LED dies disposed on carrier tape, according to another embodiment. Operations 101B, 102B, 104B, 106B, 108B, and 110B are similar to operations 101A, 102A, 104A, 106A, 108A, and 110A described above with reference to FIG. 1A. Briefly, in operation 101B a substrate is provided for epitaxially forming a light emitting diode (LED), in operation 102B an epitaxial layer is formed on the substrate, in operation 104B wafer fabrication techniques are used to form an LED wafer assembly, in operation 106B probing and testing are optionally performed on the LED dies, in operation 108B the wafer is mounted onto a saw tape and the LED dies are singulated, and in operation 110B the saw tape with the LED dies mounted thereon is expanded. Since operations 101B, 102B, 104B, 106B, 108B, and 110B are substantially the same as operations 101A, 102A, 104A, 106A, 108A, and 110A, further details regarding operations 101B, 102B, 104B, 106B, 108B, and 110E are provided with reference to FIG. 1A.

In operation 111B, a pick and place procedure is performed on the individual LED dies. During the pick and place procedure, LED dies that are disposed on the expanded saw tape are picked off the expanded saw tape and disposed onto a carrier tape. As part of this pick and place procedure, the LED dies are sorted and binned and can be placed on the carrier tape in an order different from their order on the saw tape. In one embodiment, the X and Y values determined during operation 106B are used to bin the LED dies according to desired characteristics. In one embodiment, the LED dies are sorted and binned in groups such that the LED dies within a group each have a wavelength difference between the LED dies that is less than 2.5 nm. These LED dies are then mounted on a new carrier tape to form a wafer assembly having similar wavelength characteristics. An example of carrier tape is the SPV-224/214 product manufactured by Nitto Denko Corporation of Osaka, Japan. Other examples of carrier tape that are known to those skilled in the art can be used. The characteristics or wavelengths may be configured as desired.

In operation 112B, the LED dies, which are disposed on the carrier tape, are packaged using substrate free packaging techniques. The substrate free packaging techniques are used to encapsulate the LED die, form a phosphor and/or lens on the LED die, form contacts to the LED die leads, make electrical connections, etc., as described in further detail with reference to FIGS. 3-5. Next, in operation 114B, a test and sort operation substantially similar to the test and sort operation described in operation 114A is used to test the packaged LEDs and sort the packaged LED dies. Testing the packaged LED dies can include testing for characteristics such as light output, correlated color temperature (CCT), color rendering index (CRI), voltage across contacts, etc. Sorting can be done according to any predetermined testable parameters such as resistance, light output, efficiency, etc. The process ends in operation 120B after the LED dies are tested and sorted.

Figure 2A:
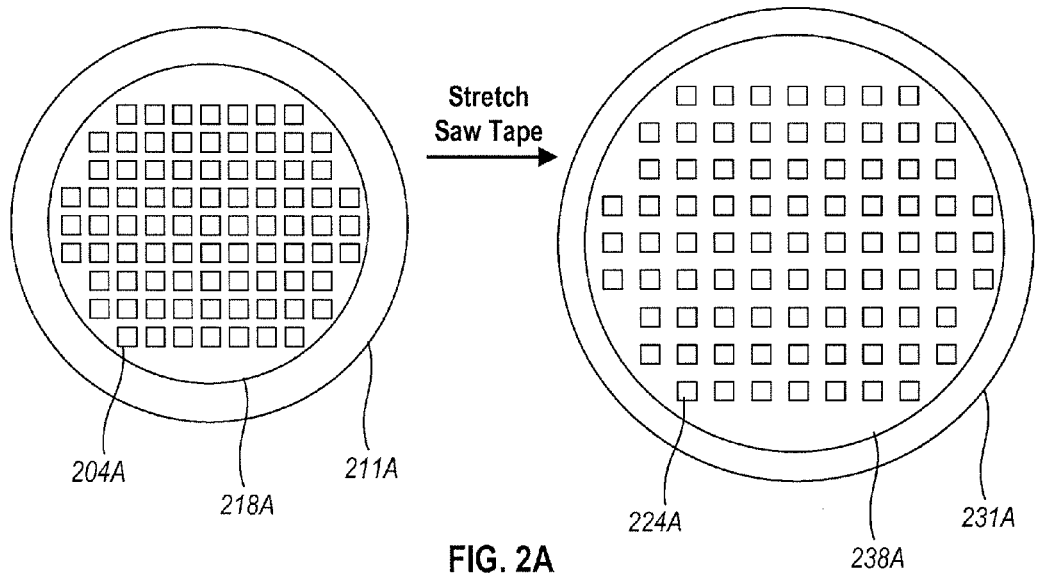
FIG. 2A illustrates a wafer with LED dies placed on saw tape, both before and after the saw tape has been expanded, according to embodiments.

FIG. 2A illustrates a wafer placed on saw tape both before and after the saw tape has been expanded. The left illustration on FIG. 2A shows an LED wafer 218A, which includes LED dies 204A, mounted on a saw tape 211A before the saw tape 211A has been expanded. During operations, the LED wafer 218A is mounted onto a saw tape 211A and then cut into individual dies. The cutting process singulates the dies 204A into individual dies without cutting all the way through the saw tape 211A. This process leaves the dies 204A attached to the saw tape 211A, which is expandable, in the same configuration that the dies 204A were on the wafer 218A. The right side of FIG. 2A shows an LED wafer 218A, which includes LED dies 204A, mounted on a saw tape 211A after the saw tape 211A has been expanded. By singulating the LED dies 204A on the saw tape 211A and expanding the saw tape 211A, as is further described with reference to operation 110A, the individual LED dies 204A are spaced further apart from each other than they are on the wafer. Increasing the spacing between the LED dies 204A makes it easier to perform packaging steps on the separated LED dies. In one embodiment, the singulation is performed by front-side laser scribing the LED wafer assembly into individual LED dies 204A. The scribing is performed to a depth that does not cut all the way through the saw tape 211A. In another embodiment, the LED wafer 218A is mounted onto the saw tape 211A, and the LED dies 204A are singulated into groups of dies or arrays. Each group of dies or array is then processed as illustrated in FIGS. 3-5.

Figure 2B:
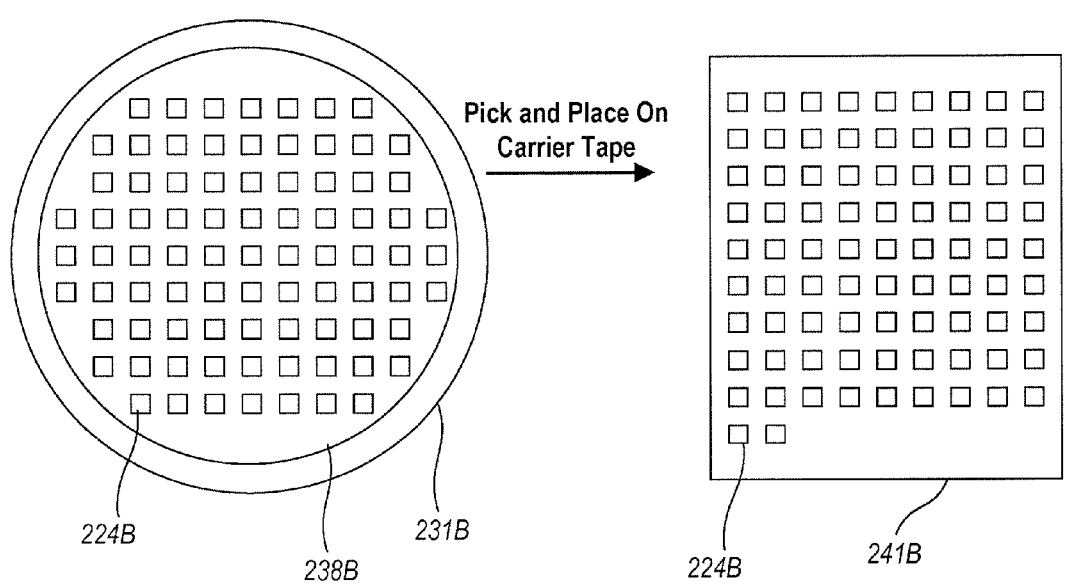
FIG. 2B illustrates a diced LED wafer with LED dies, disposed on saw tape that has been expanded, and LED dies that have been picked and placed from the saw tape onto a carrier tape where they will undergo substrate free LED packaging, according to embodiments.

FIG. 2B illustrates a diced LED wafer 238B with LED dies 224B, disposed on saw tape 231B that has been expanded, and LED dies 224B that have been picked and placed from the saw tape 231B onto a carrier tape 241B where they will undergo substrate free LED packaging, according to embodiments. The left illustration on FIG. 2B shows an LED wafer 238B, which includes LED dies 224B, mounted on a saw tape 231B after the saw tape 231B has been expanded. As explained with reference to FIG. 2A, during operations, the LED wafer assembly 238B is mounted onto a saw tape 231B, cut into individual dies 224B and then expanded by expanding the saw tape 231B. The cutting process singulates the LED dies 224B into individual dies without cutting all the way through the saw tape 231B. This process leaves the LED dies 224B attached to the saw tape 231B, which is expandable, in the same configuration that the LED dies 224B were on the wafer 238B. The right side of FIG. 2B shows the LED dies 224 after they have been picked and placed from the saw tape 231B onto a carrier tape 241B. The LED dies 224B will undergo substrate free LED packaging while they are disposed on the carrier tape 241B. The pick and place procedure is described in further detail with reference to operation 111B, in FIG. 1B. After the LED dies 224B are picked and placed onto the carrier tape, the LED dies 224B undergo substrate free LED packaging as described in further detail with reference to FIGS. 1B and 3-5.

Figure 3A:
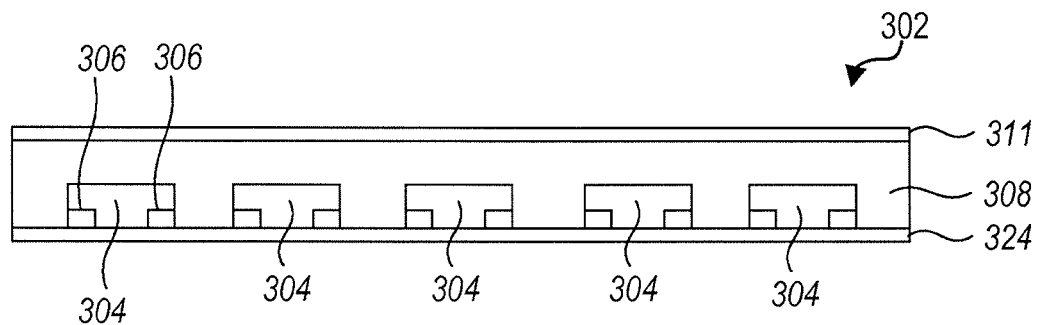
FIGS. 3A-3C illustrate a cross-sectional view of a substrate free LED package having a flat lens structure, at various stages of the fabrication process, according to an embodiment.
Figure 3B:
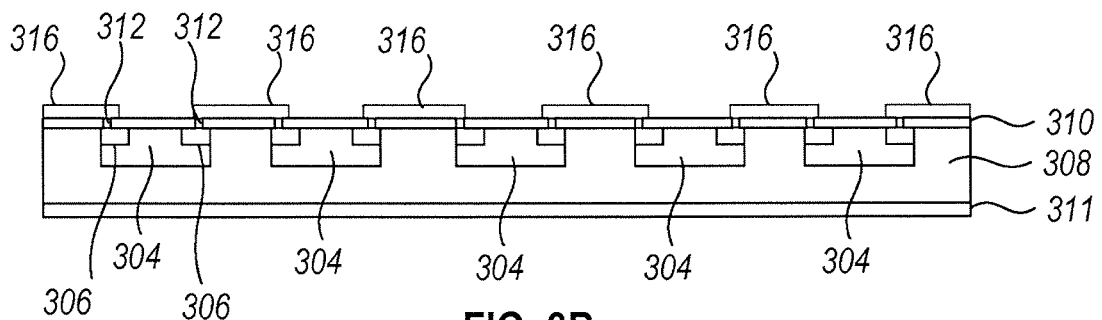
Figure 3C:
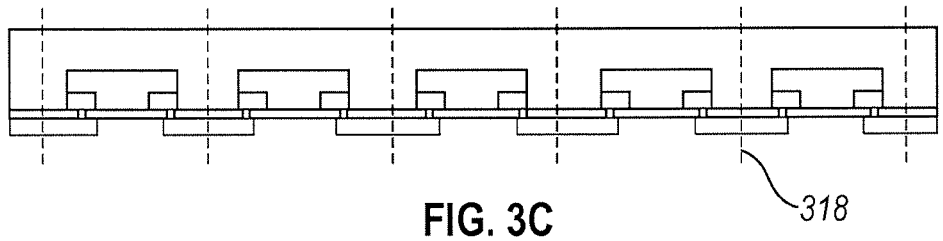
Figure 3D:
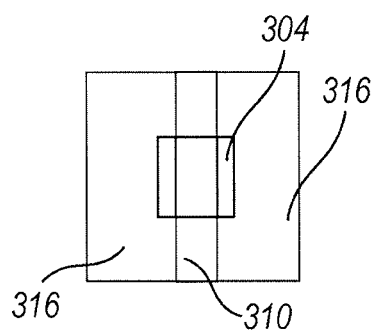
FIG. 3D illustrates a bottom view of the substrate free LED package having flat lens structure after singulation, according to embodiments.

FIGS. 3A-3C illustrate a cross-sectional view of a substrate free LED package having a flat lens structure, at various stages of the fabrication process, according to an embodiment. FIG. 3D illustrates a bottom view of the substrate free LED package having flat lens structure after singulation, according to embodiments.

FIGS. 3A-3D, illustrate the substrate free LED process by generally depicting an LED structure being packaged at various stages as described in FIGS. 1A-1B at operations, 112A, and 112B. More specifically, with reference to FIG. 1A, the substrate free fabrication process may be performed at operation 112A after the mounting and singulation operation 108A and the expansion operation 110A. Alternatively, as illustrated in FIG. 1B, the substrate free fabrication process may be performed at operation 112E after the pick and place operation 111B.

In FIG. 3A, the LED wafer assembly 302 includes LED dies 304 that can include at least one of a vertical LED structure with electrical contacts on the same side, lateral LED structure, flip chip, or thin-film LED structure. In this embodiment, the LED wafer assembly 302 includes a plurality of LED dies 304 each having die contacts 306. The LED dies 304 are mounted on tape 324, which can be either saw tape, as described in operation 112A, or carrier tape, as described in operation 112B. An example of saw tape is the PROFILM™ DU177E product manufactured by Advantek, Inc. with Global Operation Headquarters in Calamba City, Philippines. An example of carrier tape is the SPV-224/214 product manufactured by Nitto Denko Corporation of Osaka, Japan. Other examples of saw tape and carrier tape can be used that are known to those skilled in the art.

An encapsulation structure 308, which is formed over the LED dies 304, is formed by molding the encapsulation materials on the LED dies 304 and tape 324. The shape of the encapsulation structure 308 is illustrated as being a flat conformal structure but can have other shapes, as described with reference to FIGS. 4A-4D. In one embodiment, the encapsulation structure 308 includes a transparent silicone layer of molded lenses formed over the LED dies 304. In another embodiment, the encapsulation structure 308 includes a silicone layer having suspended phosphor particles formed over the LED dies 304. In still another embodiment, the encapsulation structure 308 includes a layer of conformal phosphor formed over the LED dies 304. The encapsulation structure 308 may also include a textured surface as described with reference to U.S. Patent Application Publication Nos. 2011/0089457, 2011/0025191, 2011/0026263, and 2011/0089454, each of which is hereby incorporated by reference. FIG. 3A further illustrates a protective film 311 formed on the encapsulation structure 308. The protective film 311 includes a mold release film such as the FLUON® ETFE product manufactured by Asahi Glass Co., Ltd. of Tokyo, Japan. Other mold release films can be used that are known to those skilled in the art.

In FIG. 3B, the LED wafer assembly 302 includes the plurality of LED dies 304 each having die contacts 306, encapsulation structure 308, dielectric layer 310, protective film 311, via 312, and an oversized contact region 316. The tape 324, which can be saw tape or carrier tape, is removed. During the formation of the wafer assembly illustrated in FIG. 3B, an etching or cleaning process is optionally performed to remove any impurities. The dielectric layer 310, the via 312, and the oversized contact region 316 are formed after the tape 324 is removed and the optional etching and/or cleaning processes are performed. The dielectric layer 310, can optionally include a Distributed Bragg Reflector (DBR) structure. The DBR structure may be fabricated using a series of alternating high index/low index dielectric materials. A series of 2 pairs of ¼λ $SiO_2$ and ¼λ $TiO_2$ over a layer of 1¾λ $SiO_2$ is used to enhance the reflectivity at lower angles. A DBR structure uses optical interference to affect reflectivity; as a result, their thickness is more critical than the thickness of the underlying thick $SiO_2$ layer.

In one embodiment, the dielectric layer 310 is a DBR having a multi-layer stack structure using a combination of high and low refractive index materials. In an embodiment, the two materials chosen have indices of refraction that are as different as possible to maximize the reflectivity of a stack over all angles. Chosen materials also should have very low absorption at the wavelength emitted by the LED. In another embodiment, a high-index material is $TiO_2$ and a lower index material is $SiO_2$. Materials suitable for high index layers are titanium dioxide ($TiO_2$), $Ti_3O_5$, $Ti_2O_3$, TiO, $ZrO_2$+$TiO_2ZrO_2Nb_2O_5$, $CeO_2$, ZnS, $Al_2O_3$, niobium pentoxide ($Nb_2O_5$), and tantalum pentoxide ($Ta_2O_5$). Suitable low index materials include SiO, $SiO_2$, and $MgF_2$. In some embodiments, low and/or high refraction index materials may be polymers such as siloxane polymers or others known to one knowledgeable in the art.

In one embodiment, the thicknesses of DBR layers are odd multiples of quarter wavelengths. In an embodiment, a two layer combination, or pair, of high $n_H$/low $n_L$ index of refraction materials is repeated at least twice, giving a four layer structure of high $n_H$/low $n_L$/high $n_H$/low $n_L$. The DBR layers may be deposited using evaporation, physical vapor deposition, atomic layer deposition (ALD), or other well-known techniques in the art. The DBR may be formed as described with reference to U.S. Pat. No. 7,622,746, which is hereby incorporated by reference.

The dielectric layer 310 is formed with vias 312 disposed therein. The via 312 is configured to electrically couple the die contact 306 of the LED die 304 to the oversized contact region 316. In one embodiment, the via 312 has a surface area that is smaller than the surface area of the die contact 306. In another embodiment, the via 312 has a surface area that is equivalent to the surface area of the die contact 306. The via 312 and the oversized contact region 316 may be formed from conductive materials such as, for example, Al, Ag, Rh, Pd, Cu, Au, Cr, Ti, W, and Ni, and their alloys. The die contact 306 can be formed from conductive materials such as, for example, Al, Ag, Rh, Pd, Cu, Au, Cr, Ti, W, and Ni, and their alloys. Once the wafer assembly 302 has been processed, as shown in FIG. 3B, the wafer assembly is considered to be a virtual LED wafer or substrate free LED package because it is ready for dicing, as illustrated with reference to FIG. 3C.

FIG. 3C is an illustration showing a singulation process that is performed on the virtual LED wafer assembly to form a functional LED substrate free package. In one embodiment, singulation is performed by using a dicing saw that divides the virtual LED wafer assembly into individual dies or LED substrate free packages as shown along lines 318. Optionally, the LED substrate free package may be probe tested and binned prior to or after singulation.

The oversized contact region 316 is patterned to be oversized or have a fanned shape, e.g., fan out structure, as shown in FIG. 3D. A fan out structure can include any structure that expands the surface area of a primary electrical contact to make it easier to make external electrical connections to the primary electrical contact. FIG. 3D is an illustration showing the fan out structure fabricated using the operations described above with reference to FIGS. 3A-3C. The oversized contact region 316 can be patterned to extend over the edge of the die and extend to about half of the die size, without making contact with other contact regions of opposite polarity, as shown in FIG. 3D. The oversized contact region 316 may include any type of geometric pattern.

Figure 4A:
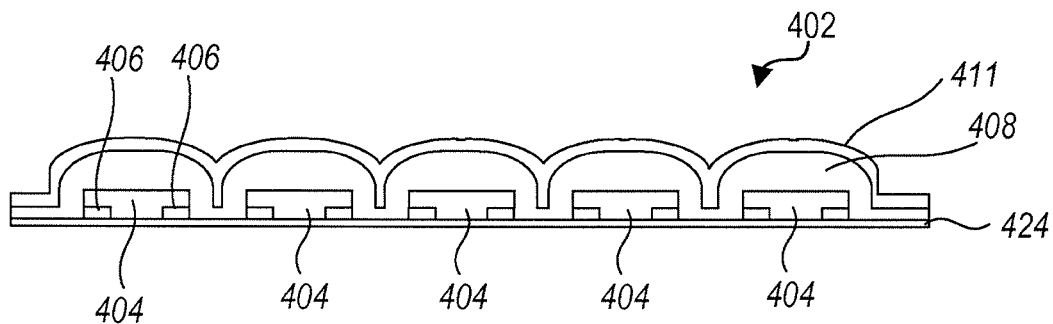
FIGS. 4A-4C illustrate a cross-sectional view of a substrate free LED package having a dome lens structure, at various stages of the fabrication process, according to another embodiment.
Figure 4B:
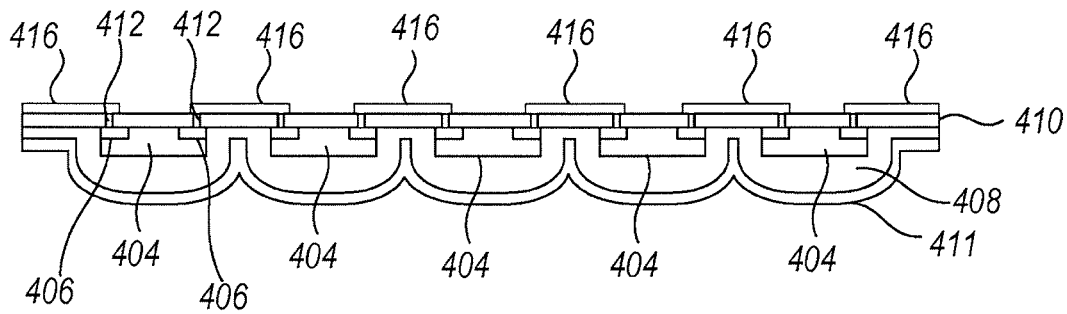
Figure 4C:
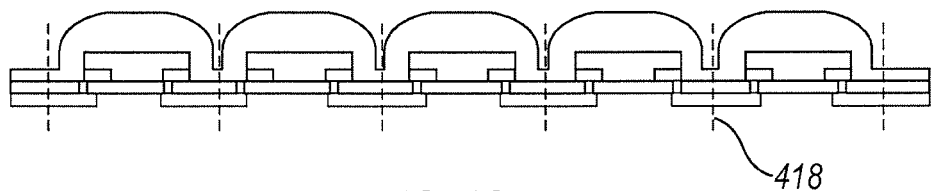
Figure 4D:
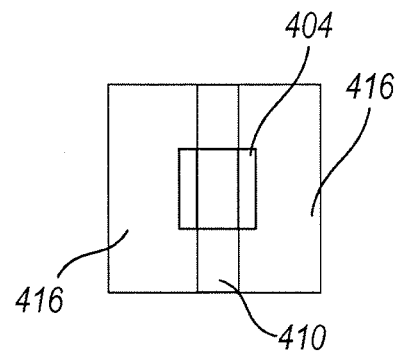
FIG. 4D illustrates a bottom view of the substrate free LED package having a dome lens structure after singulation, according to embodiments.

FIGS. 4A-4C illustrate a cross-sectional view of a substrate free LED package having a dome lens structure, at various stages of the fabrication process, according to another embodiment. FIG. 4D illustrates a bottom view of the substrate free LED package having a dome lens structure after singulation, according to embodiments.

FIGS. 4A-4D, illustrate the substrate free LED process by generally depicting an LED structure having a dome shaped lens being packaged at various stages as described in FIGS. 1A-1B at operations, 112A, and 112B. More specifically, with reference to FIG. 1A, the substrate free fabrication process may be performed at operation 112A after the mounting and singulation operation 108A and the expansion operation 110A. Alternatively, as illustrated in FIG. 1B, the substrate free fabrication process may be performed at operation 112B after the pick and place operation 111B.

In FIG. 4A, the LED wafer assembly 402 includes LED dies 404 that can include at least one of a vertical LED structure with electrical contacts on the same side, lateral LED structure, flip chip, or thin-film LED structure. In this embodiment, the LED wafer assembly 402 includes a plurality of LED dies 404 each having die contacts 406. The LED dies 404 are mounted on tape 424, which can be either saw tape, as described in operation 112A, or carrier tape, as described in operation 112B. An example of saw tape is the PROFILM™ DU177E product manufactured by Advantek, Inc. with Global Operation Headquarters in Calamba City, Philippines. An example of carrier tape is the SPV-224/214 product manufactured by Nitto Denko Corporation of Osaka, Japan. Other examples of saw tape and carrier tape can be used that are known to those skilled in the art.

An encapsulation structure 408, which is formed over the LED dies 404, is formed by molding the encapsulation materials on the LED dies 404 and tape 424. The shape of the encapsulation structure 408 is illustrated as being a curved structure such as a dome shape or hemispherical shape. However, the structure can have other shapes as described herein with reference to the other FIGS. 1A-5D. In one embodiment, the encapsulation structure 408 includes a transparent silicone layer of molded lenses formed over the LED dies 404. In another embodiment, the encapsulation structure 408 includes a silicone layer having suspended phosphor particles formed over the LED dies 404. In still another embodiment, the encapsulation structure 408 includes a layer of conformal phosphor formed over the LED dies 404. The encapsulation structure 408 may also include a textured surface as described with reference to U.S. Patent Application Publication Nos. 2011/0089457, 2011/0025191, 2011/0026263, and 2011/0089454, each of which is hereby incorporated by reference. FIG. 4A further illustrates a protective film 411 formed on the encapsulation structure 408. The protective film 411 includes a mold release film such as the FLUON® ETFE product manufactured by Asahi Glass Co., Ltd. of Tokyo, Japan. Other mold release films, which are known to those skilled in the art, can also be used.

In FIG. 4B, the LED wafer assembly 402 includes the plurality of LED dies 404 each having die contacts 406, curved encapsulation structure 408, dielectric layer 410, protective film 411, contact 412, and an oversized contact region 416. The tape 424, which can be saw tape or carrier tape, is removed. During the formation of the wafer assembly illustrated in FIG. 4B, an etching or cleaning process is optionally performed to remove any impurities. The dielectric layer 410, the contact 412, and the oversized contact region 416 are formed after the tape 424 is removed and the optional etching and/or cleaning processes are performed. The dielectric layer 410, can optionally include a Distributed Bragg Reflector (DBR) structure. The DBR structure may be fabricated using a series of alternating high index/low index dielectric materials. A series of 2 pairs of ¼λ $SiO_2$ and ¼λ $TiO_2$ over a layer of 1¾λ $SiO_2$ is used to enhance the reflectivity at lower angles. A DBR structure uses optical interference to affect reflectivity; as a result, their thickness is more critical than the thickness of the underlying thick $SiO_2$ layer.

In one embodiment, the dielectric layer 410 is a DBR having a multi-layer stack structure using a combination of high and low refractive index materials. In an embodiment, the two materials chosen have indices of refraction that are as different as possible to maximize the reflectivity of a stack over all angles. Chosen materials also should have very low absorption at the wavelength emitted by the LED. In another embodiment, a high-index material is $TiO_2$ and a lower index material is $SiO_2$. Materials suitable for high index layers are titanium dioxide ($TiO_2$), $Ti_3O_5$, $Ti_2O_3$, TiO, $ZrO_2$+$TiO_2$$ZrO_2$$Nb_2O_5$, $CeO_2$, ZnS, $Al_2O_3$, niobium pentoxide ($Nb_2O_5$), and tantalum pentoxide ($Ta_2O_5$). Suitable low index materials are SiO, $SiO_2$, and $MgF_2$. In some embodiments, low and/or high refraction index materials may be polymers such as siloxane polymers or others known to one knowledgeable in the art.

In one embodiment, the thicknesses of DBR layers are odd multiples of quarter wavelengths. In an embodiment, a two layer combination, or pair, of high $n_H$/low $n_L$ index of refraction materials is repeated at least twice, giving a four layer structure of high $n_H$/low $n_L$/high $n_H$/low $n_L$. The DBR layers may be deposited using evaporation, physical vapor deposition, atomic layer deposition (ALD), or other well-known techniques in the art. The DBR may be formed as described with reference to U.S. Pat. No. 7,622,746, which is hereby incorporated by reference.

The dielectric layer 410 is formed with vias 412 disposed therein. The via 412 is configured to electrically couple the die contact 406 of the LED die 404 to the oversized contact region 416. In one embodiment, the via 412 has a surface area that is smaller than the surface area of the die contact 406. In another embodiment, the via 412 has a surface area that is equivalent to the surface area of the die contact 406. The via 412 and the oversized contact region 416 may be formed from conductive materials such as, for example, Al, Ag, Rh, Pd, Cu, Au, Cr, Ti, W, and Ni, and their alloys. The die contact 406 can be formed from conductive materials such as, for example, Al, Ag, Rh, Pd, Cu, Au, Cr, Ti, W, and Ni, and their alloys. Once the wafer assembly 402 has been processed, as shown in FIG. 4B, the wafer assembly is considered to be a virtual LED wafer or substrate free LED package because it is ready for dicing, as illustrated with reference to FIG. 4C.

FIG. 4C is an illustration showing a singulation process that is performed on the virtual LED wafer assembly to form a functional LED substrate free package. In one embodiment, singulation is performed by using a dicing saw that divides the virtual LED wafer assembly into individual dies or LED substrate free packages as shown along lines 418. Optionally, the LED substrate free package may be probe tested and binned prior to or after singulation.

The oversized contact region 416 is patterned to be oversized or have a fanned shape, e.g., fan out structure, as shown in FIG. 4D. FIG. 4D is an illustration showing the fan out structure fabricated using the operations described above with reference to FIGS. 4A-4C. The oversized contact region 416 can be patterned to extend over the edge of the die and extend to about half of the die size, without making contact with other contact regions of opposite polarity. The oversized contact region 416 may be of any type of geometric pattern.

Figure 5A:
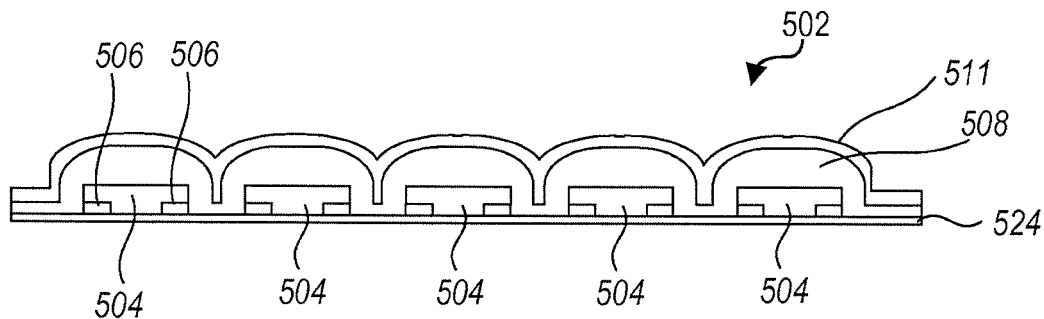
FIGS. 5A-5C illustrate a cross-sectional view of a substrate free LED package having at least two dies electrically coupled together after singulation, at various stages of the fabrication process, according to another embodiment.
Figure 5B:
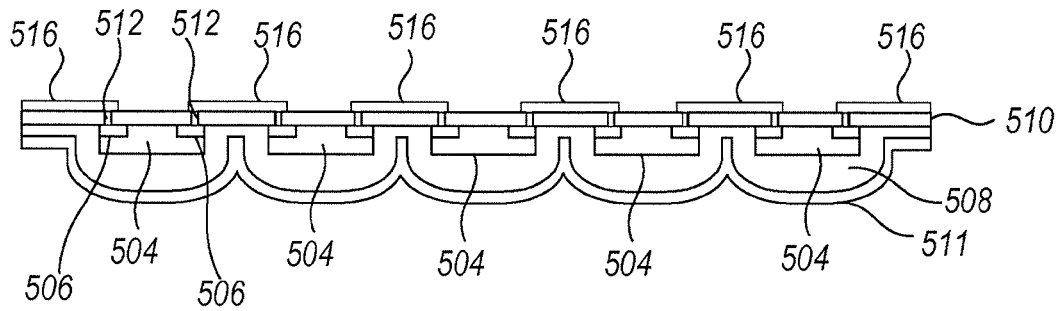
Figure 5C:
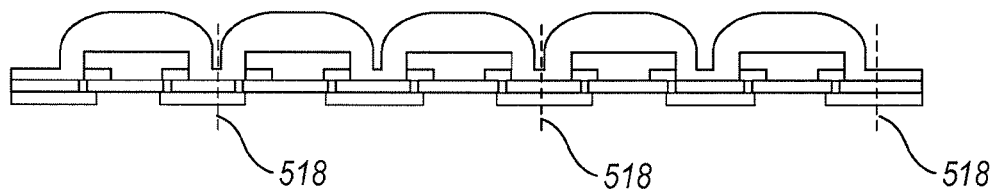
Figure 5D:
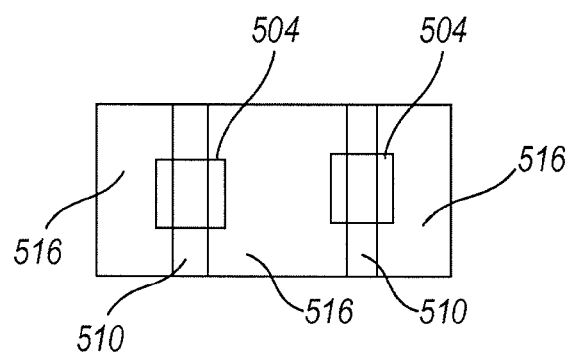
FIG. 5D illustrates a bottom view of the substrate free LED package having at least two dies electrically coupled together after singulation, according to embodiments.

FIGS. 5A-5C illustrate a cross-sectional view of a substrate free LED package having at least two dies electrically coupled together after singulation, at various stages of the fabrication process, according to another embodiment. FIG. 5D illustrates a bottom view of the substrate free LED package having at least two dies electrically coupled together after singulation, according to embodiments.

FIGS. 5A-5D, illustrate the substrate free LED process by generally depicting an LED structure being packaged at various stages as described in FIGS. 1A-1B at operations, 112A, and 112B. More specifically, with reference to FIG. 1A, the substrate free fabrication process may be performed at operation 112A after the mounting and singulation operation 108A and the expansion operation 110A. Alternatively, as illustrated in FIG. 1B, the substrate free fabrication process may be performed at operation 112B after the pick and place operation 111B.

In FIG. 5A, the LED wafer assembly 502 includes a plurality of LED dies 504 that can include at least one of a vertical LED structure with electrical contacts on the same side, lateral LED structure, flip chip, or thin-film LED structure. In this embodiment, the LED wafer assembly 502 includes a plurality of LED dies 504 each having die contacts 506. The LED dies 504 are mounted on tape 524, which can be either saw tape, as described in operation 112A, or carrier tape, as described in operation 112B. An example of saw tape is the PROFILM™ DU177E product manufactured by Advantek, Inc. with Global Operation Headquarters in Calamba City, Philippines. An example of carrier tape is the SPV-224/214 product manufactured by Nitto Denko Corporation of Osaka, Japan. Other examples of saw tape and carrier tape can be used that are known to those skilled in the art.

An encapsulation structure 508, which is formed over the LED dies 504, is formed by molding the encapsulation materials on the LED dies 504 and tape 524. The shape of the encapsulation structure 508 can be a flat conformal structure, dome structure, or other lens structure. The shape of the encapsulation structure 508 is illustrated as being a dome shape in FIG. 5A. In one embodiment, the encapsulation structure 508 includes a transparent silicone layer of molded lenses formed over the LED dies 504. In another embodiment, the encapsulation structure 508 includes a silicone layer having suspended phosphor particles formed over the LED dies 504. In still another embodiment, the encapsulation structure 508 includes a layer of conformal phosphor formed over the LED dies 504. The encapsulation structure 508 may also include a textured surface as described with reference to U.S. Patent Application Publication Nos. 2011/0089457, 2011/0025191, 2011/0026263, and 2011/0089454, each of which is hereby incorporated by reference. FIG. 5A further illustrates a protective film 511 formed on the encapsulation structure 508. The protective film 511 includes a mold release film such as the FLUON® ETFE product manufactured by Asahi Glass Co, Ltd. of Tokyo, Japan. Other mold release films can be used, as known to those skilled in the art.

In FIG. 5B, the LED wafer assembly 502 includes the plurality of LED dies 504 each having die contacts 506, encapsulation structure 508, dielectric layer 510, protective film 511, contact 512, and oversized contact region 516. The tape 524, which can be saw tape or carrier tape, is removed. During the formation of the wafer assembly illustrated in FIG. 5B, an etching or cleaning process is optionally performed to remove any impurities. The dielectric layer 510, the contact 512, and the oversized contact region 516 are formed after the tape 524 is removed and the optional etching and/or cleaning processes are performed. The dielectric layer 510 can optionally include a Distributed Bragg Reflector (DBR) structure. The DBR structure may be fabricated using a series of alternating high index/low index dielectric materials. A series of 2 pairs of ¼λ $SiO_2$ and ¼λ $TiO_2$ over a layer of 1¾λ $SiO_2$ is used to enhance the reflectivity at lower angles. A DBR structure uses optical interference to affect reflectivity; as a result, their thickness is more critical than the thickness of the underlying thick $SiO_2$ layer.

In one embodiment, the dielectric layer 510 is a DBR having a multi-layer stack structure using a combination of high and low refractive index materials. In an embodiment, the two materials chosen have indices of refraction that are as different as possible to maximize the reflectivity of a stack over all angles. Chosen materials also should have very low absorption at the wavelength emitted by the LED. In another embodiment, a high-index material is $TiO_2$ and a lower index material is $SiO_2$. Materials suitable for high index layers are titanium dioxide ($TiO_2$), $Ti_3O_5$, $Ti_2O_3$, TiO, $ZrO_2$+ $TiO_2ZrO_2Nb_2O_5$, $CeO_2$, ZnS, $Al_2O_3$, niobium pentoxide ($Nb_2O_5$), and tantalum pentoxide ($Ta_2O_5$). Low index materials are SiO, $SiO_2$, and $MgF_2$. In some embodiments, low and/or high refraction index materials may be polymers such as siloxane polymers or others known to one knowledgeable in the art.

In one embodiment, the thicknesses of DBR layers are odd multiples of quarter wavelengths. In an embodiment, a two layer combination, or pair, of high $n_H$/low $n_L$ index of refraction materials is repeated at least twice, giving a four layer structure of high $n_H$/low $n_L$/high $n_H$/low $n_L$. The DBR layers may be deposited using evaporation, physical vapor deposition, atomic layer deposition (ALD), or other well-known techniques. The DBR may be formed as described with reference to U.S. Pat. No. 7,622,746, which is hereby incorporated by reference.

The dielectric layer 510 is formed with vias 512 disposed therein. The vias 512 are configured to electrically couple the die contact 506 of the LED die 504 to the oversized contact region 516. The oversized contact region 516 is configured to electrically couple at least two LED dies 504 to each other by electrically coupling the die contacts 506 on the two LED dies 504. In one embodiment, the via 512 has a surface area that is smaller than the surface area of the die contact 506. In another embodiment, the via 512 has a surface area that is equivalent to the surface area of the die contact 506. The via 512 and the oversized contact region 516 may be formed from conductive materials such as, for example, Al, Ag, Rh, Pd, Cu, Au, Cr, Ti, W, and Ni, and their alloys. Once the wafer assembly 502 has been processed, as shown in FIG. 5B, the wafer assembly is considered to be a virtual LED wafer or substrate free LED package because it is ready for dicing, as illustrated with reference to FIG. 5C.

FIG. 5C is an illustration showing a singulation process that is performed on the now formed virtual LED wafer assembly to form a functional LED substrate free package. In one embodiment, singulation is performed by using a dicing saw that divides the virtual LED wafer assembly into individual dies or LED substrate free packages, as shown along lines 518. Optionally, the LED substrate free package may be probe tested and binned prior to or after singulation. Once the virtual LED wafer assembly is singulated along lines 518, the each resulting LED package includes at least two LED dies 504 electrically coupled through the via 512 and the oversized contact region 516. Although FIG. 5C shows that an array having two electrically coupled LED dies will be formed if the LED substrate package is cut along lines 518, arrays with more electrically coupled LED dies can be formed if the cut lines 518 are made in other areas.

The oversized contact region 516 can be patterned to be oversized or have a fanned shape, e.g., fan out structure, as shown in FIG. 5D. FIG. 5D is an illustration showing the fan out structure fabricated using the operations described above with reference to FIGS. 5A-5C. The oversized contact region 516 can be patterned to extend over the edge of the die and extend to about half of the die size, without making contact with other contact regions of opposite polarity, as shown in FIG. 5D. The oversized contact region 516 may include any type of geometric pattern.

The inventions and methods described herein can be viewed as a whole, or as a number of separate inventions that can be used independently or mixed and matched as desired. All inventions, steps, processes, devices, and methods described herein can be mixed and matched as desired. All previously described features, functions, or inventions described herein or by reference may be mixed and matched as desired.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a substrate free light emitting diode (LED), comprising:
    disposing a wafer having a plurality of LED dies on a saw tape in a particular order;
    using a pick and place procedure to arrange the plurality of LED dies on a carrier tape to form an LED wafer assembly, wherein the plurality of LED dies are arranged on the carrier tape by grouping the LED dies such that each LED die within a group has a wavelength difference between LED dies that is within a predetermined threshold value, and wherein the LED wafer assembly is formed based on the grouping of the LED dies such that the LED dies in each group are all arranged on the carrier tape in a different order from the particular order on the saw tape;
    molding an encapsulation structure over at least one of the plurality of LED dies on a first side of the LED wafer assembly;
    removing the tape; and
    singulating the LED wafer assembly into predetermined regions comprising at least one LED.

2. The method of claim 1, further comprising singulating the plurality of LED dies by cutting the wafer completely through and partially cutting the saw tape to a depth less than a thickness of the saw tape; and
    expanding the saw tape to increase spacing between the singulated plurality of LED dies.

3. The method of claim 1, wherein the molding of the encapsulation structure comprises molding a phosphor loaded silicon material over the plurality of LED dies.

4. The method of claim 1, wherein the molding of the encapsulation structure comprises molding a lens selected from the group consisting of a flat lens, a dome lens, or a Fresnel lens.

5. The method of claim 1, further comprising forming a dielectric layer on a second side of the LED wafer assembly.

6. A method of fabricating a substrate free light emitting diode (LED), the method comprising:
    disposing a wafer having a plurality of LED dies on a saw tape;
    arranging the plurality of LED dies from the saw tape onto a carrier tape to form an LED wafer assembly, wherein the plurality of LED dies are arranged on the carrier tape by grouping the LED dies such that each LED die within a group has a wavelength difference between LED dies that is within a predetermined threshold value;
    molding an encapsulation structure over at least one of the plurality of LED dies on a first side of the LED wafer assembly;
    removing the carrier tape;
    forming a dielectric layer on a second side of the LED wafer assembly;
    forming an oversized contact region on the dielectric layer; and
    singulating the LED wafer assembly into regions that each comprise at least one LED.

7. A method of fabricating a substrate free light emitting diode (LED), comprising:
    disposing a wafer having a plurality of LED dies on a saw tape in a particular order;
    using a pick and place procedure to arrange the plurality of LED dies on a carrier tape to form an LED wafer assembly, the plurality of LED dies comprising die contacts, wherein the plurality of LED dies are arranged on the carrier tape by grouping the LED dies such that each LED die within a group has a wavelength difference between LED dies that is within a predetermined threshold value, and wherein the LED wafer assembly is formed based on the grouping of the LED dies such that the LED dies in each group are all arranged on the carrier tape in a different order from the particular order on the saw tape;
    molding an encapsulation structure over at least one of the plurality of LED dies on a first side of the LED wafer assembly;
    removing the tape to expose the die contacts;
    electrically coupling at least one die contact from a first die with at least one die contact from a second die; and
    singulating the LED wafer assembly into predetermined regions comprising at least the electrically coupled first die and second die.

8. The method of claim 7, further comprising singulating the plurality of LED dies by cutting the wafer completely through and partially cutting the saw tape to a depth less than a thickness of the saw tape; and
    expanding the saw tape to increase spacing between the singulated plurality of LED dies.

9. The method of claim 7, further comprising:
    forming a dielectric layer on a second side of the LED wafer assembly; and
    forming an oversized contact region on the dielectric layer.

* * * * *